United States Patent [19]
Pfaff et al.

[11] Patent Number: 6,124,720
[45] Date of Patent: Sep. 26, 2000

[54] TEST SOCKET FOR SURFACE MOUNT DEVICE PACKAGES

[75] Inventors: Wayne K. Pfaff, Dallas County; Richard C. Muehling, Tarrant County, both of Tex.

[73] Assignee: Plastronics Socket Company, Inc., Irving, Tex.

[21] Appl. No.: 09/184,668

[22] Filed: Nov. 2, 1998

[51] Int. Cl.[7] .............................. G01R 31/02; H01R 12/00
[52] U.S. Cl. ............................ 324/755; 324/754; 439/66; 439/73
[58] Field of Search .................................... 324/754, 755, 324/765, 757, 761, 762; 439/61, 68–73, 266, 743

[56] References Cited

U.S. PATENT DOCUMENTS

| | | | |
|---|---|---|---|
| 4,683,423 | 7/1987 | Morton | 439/266 |
| 5,108,302 | 4/1992 | Pfaff | 439/266 |
| 5,308,256 | 5/1994 | Tonooka et al. | 439/266 |
| 5,764,072 | 6/1998 | Kister | 324/754 |
| 5,847,572 | 12/1998 | Iwasaki et al. | 324/755 |

*Primary Examiner*—Safet Metjahic
*Assistant Examiner*—Anjan K Deb
*Attorney, Agent, or Firm*—Jack A. Kanz

[57] ABSTRACT

Surface mount test and/or burn-in sockets for electronic device packages are formed using contact pins supported between the top of a circuit board and the lower surface of the terminal lead. The central portion of each contact pin is secured in the socket base so that one end of the pin extends into a cavity in the socket and the other end extends from the lower surface of the socket. The ends of the contact pins are supported on curved beams which are designed to control the pressure exerted on the terminal leads and on the contact pads independently.

10 Claims, 2 Drawing Sheets

TEST SOCKET FOR SURFACE MOUNT DEVICE PACKAGES

This invention relates to burn-in and test of devices in small electronic device packages. More particularly, it relates to methods and apparatus for mounting and holding surface mount electronic device packages during burn-in and test and to establishing and maintaining positive electrical contact to closely spaced input/output terminal leads on such packages without damaging the electronic device, the device package, its interconnection terminals or the test socket.

Advances in microelectronics technology tend to develop electronic device chips and packages which occupy less space while performing more functions. As a result, the number of electrical interconnections between the device package and external circuitry required for the circuits in the chips to communicate with the outside world increases and the physical size of each such interconnection must decrease. In order to provide electrical communication between the chip and external circuitry, circuit chips are usually contained within a housing or package which supports interconnection leads, pads, etc., on one or more of its external surfaces. In order to reduce overall lead length from chip to external circuitry and to provide adequate spacing between input/output terminals on the package, high pin count devices are sometimes mounted in packages in which the input/output terminals are in the form of thin ribbon leads which extend from one or more edges of the package. In most cases, the thin leads extend from all four peripheral edges with each lead extending outwardly, downwardly and outwardly to terminate in a foot which has a lower surface lying in a plane parallel with (but slightly below) the bottom surface of the package. Such device packages (commonly known as quad flat pak or QFP packages) may thus be mounted on circuit patterns on the surface of a circuit board or the like.

As the size of the package decreases and the number of leads increases, the size and spacing of leads become smaller. Smaller and more closely spaced leads are, of course, more fragile and more difficult to contact with test probes or the like. Furthermore, long or massive contact pins cannot be used for connecting external circuitry to the input/output leads for testing when high frequency devices are involved because such contact pins, particularly when closely spaced in order to contact closely spaced leads, introduce unacceptable signal distortion.

In many cases it is desirable that the completed device package be subjected to test and/or burn-in prior to acceptance and assembly onto a circuit board. While the short leads may be directly and permanently surface mounted on a circuit board by soldering, it is much more difficult to establish and maintain temporary electrical contact with each lead without destroying or damaging the leads, the package or the encapsulated device chip. In order to reliably test and burn-in such packages, the package must be temporarily mounted in a reliable and re-useable socket which makes precision interconnection between the package leads and outside circuitry without introducing capacitance-induced, inductance-induced or impedance-induced signal distortion problems and without physically damaging the device package.

Conventional burn-in and test apparatus includes a plurality of test sockets mounted on a burn-in board with the pin-out leads of the test or burn-in socket passing through the board in conventional through-hole mountings. Interconnection of high frequency devices with outside circuitry using such conventional mounting can induce unacceptable signal distortion because of the high density of parallel terminals passing through the board. Surface mounting of test and burn-in sockets can minimize signal distortion resulting from cross-talk, reactive capacitance, etc., by spreading the interconnection circuitry across the surface of the board and reducing parallel lead lengths.

In accordance with the present invention positive electrical interconnection between terminal leads and contact pads on the surface of a circuit board or the like is obtained using flexible electrically conductive contact pins positioned between the top of a contact pad or the like on a circuit board and the lower surface of the foot of the terminal lead. The contact pin is rigidly supported in the base of a surface mount socket between the foot of the terminal lead and the top of a contact pad or the like. The central portion of the contact pin between the two ends thereof is firmly secured in the socket body to isolate the forces applied to each end. By placing the contact pin directly between the terminal lead and the contact pad and using the contact pin to make pressure contact with circuitry on the top surface of the test or burn-in board, the mass of the pin may be substantially reduced. More significantly, the physical distance (the lead length) between the terminal lead and the external circuitry to which it is connected by the contact pin is substantially reduced and the high density of parallel through-hole leads is eliminated. Thus the interconnection arrangement of the invention may be used for test and burn-in of extremely high frequency devices without introducing signal distortion problems.

Other features and advantages of the invention will become more readily understood from the following detailed description taken in connection with the appended claims and attached drawing in which:

The above-described drawing is incorporated into and forms part of the specification to illustrate exemplary embodiments of the invention. Throughout the drawing like reference numerals designate corresponding elements.

It will be recognized that the principles of the invention may be utilized and embodied in many and various forms. In order to demonstrate these principles, the invention is described herein by reference to specific preferred embodiments. The invention, however, is not limited to the specific forms illustrated and described herein. For example, while the invention is described herein with specific reference to use in connection with a QFP package, the invention is not so limited. Sockets employing the principles of the invention may be designed and used to mount, test and burn-in any of a wide variety of device packages. In addition to the QFP structure discussed in detail, the invention may be employed in sockets for packages which have leads extending from one side, two sides or any other arrangement. The socket may be designed to accommodate device packages during fabrication wherein the leads have not been formed into their final configuration (such as packages wherein the leads are held in a molded carrier ring) or at various other stages of fabrication. For example, sockets may be designed to contact the underside of leads extending from dual inline packages, gull wing packages or various other packages before (or after) the terminal leads are formed into their final configuration. It is only necessary that the test socket be surface mounted and the contact pin extend between circuitry on the surface of the board and a surface of the terminal lead extending from a device package.

Figure 1:
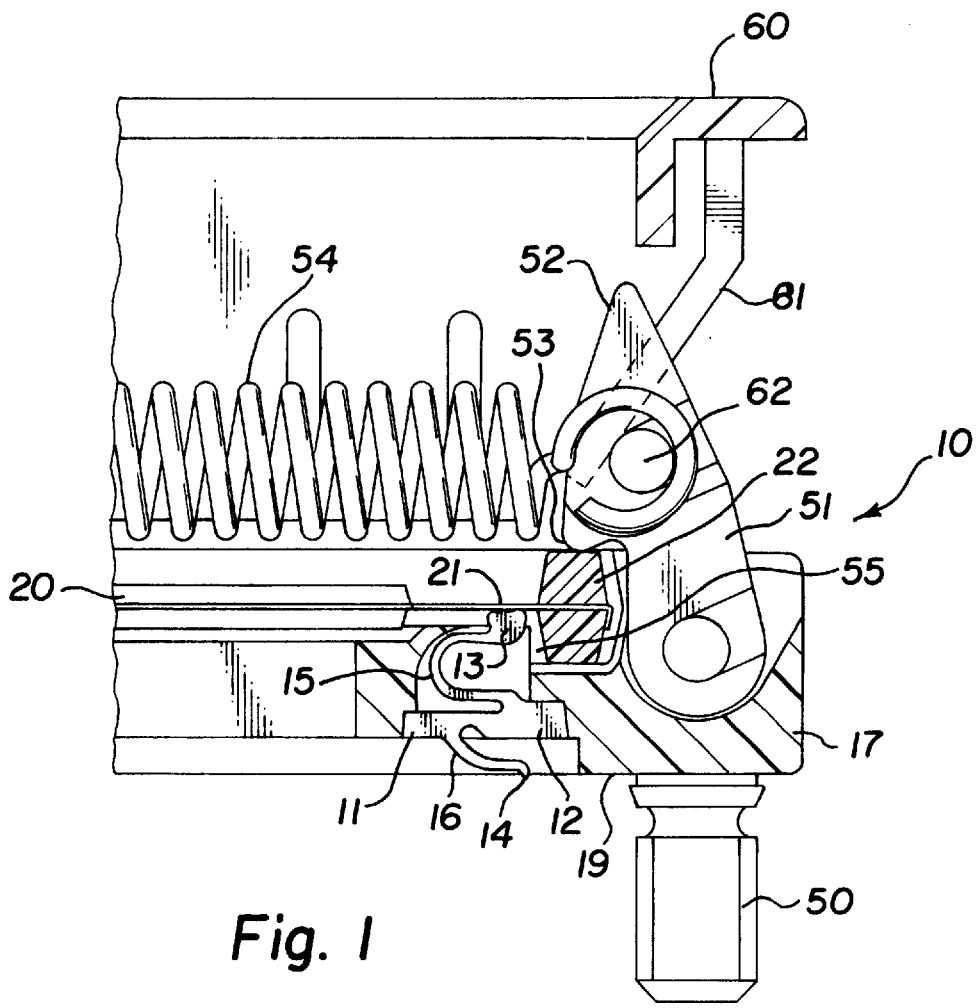
FIG. 1 is a fragmentary sectional view of a surface mountable burn-in socket employing contact pins to interconnect the lower surfaces of device package terminal leads with the top of a circuit board in accordance with the principles of the invention.
Figure 3:
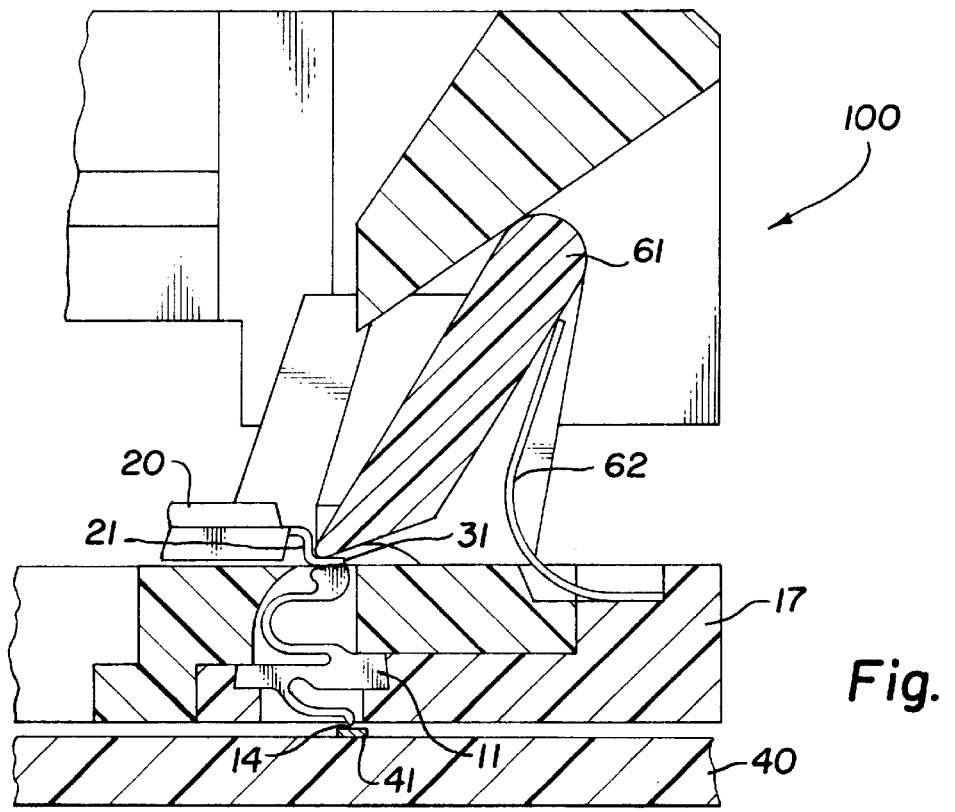
FIG. 3 is a fragmentary sectional view of an alternative embodiment of surface mounted burn-in socket employing the principles of the invention.
Figure 4:
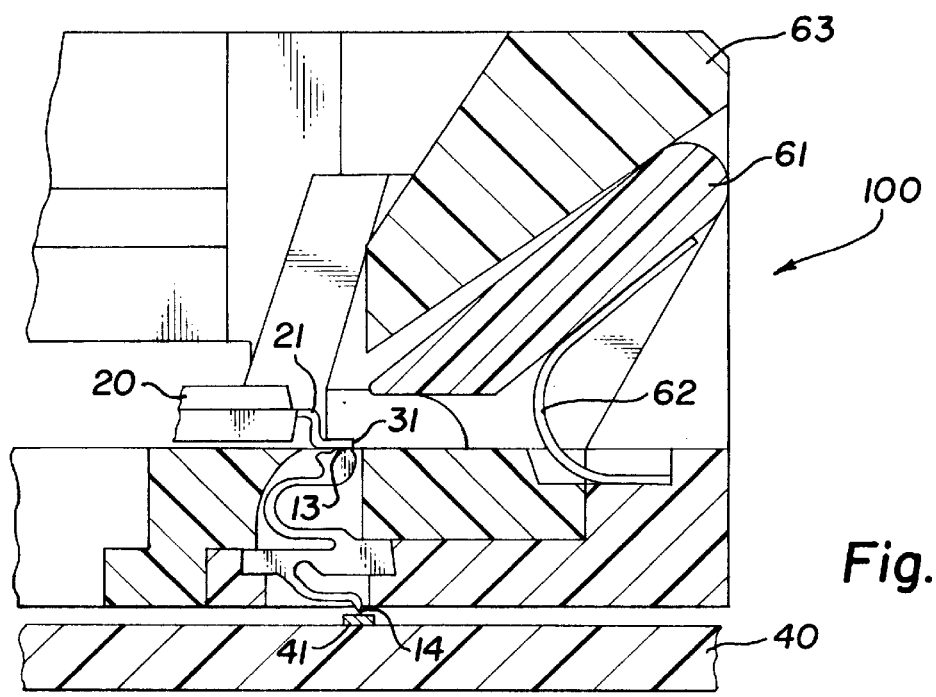
FIG. 4 is a fragmentary sectional view of the burn-in socket of FIG. 3 in the open position.

As illustrated in the embodiments of FIGS. 1, 3 and 4, the contact pin of the present invention is supported within the body of a surface mountable mounting housing or socket and arranged so that one end engages the underside of a terminal lead and the opposite end engages the top surface of a contact pad or other circuitry on a circuit board or the like. In the preferred embodiment the contact pin 11 is formed by stamping or the like from ribbon stock of flexible electrically conducting material such as gold-plated steel or alloys such as beryllium—copper, etc. It should be recognized that the term "contact pin" used herein is not to be construed as limiting the shape or composition of the body which forms electrical interconnection between the terminal lead and circuitry on the board. In the embodiments illustrated the contact pin has a base portion 12, a first end portion 13 extending from one side of the base portion 12 and a second end portion 14 extending from the opposite side. The base portion 12 is firmly secured in the base 17 of test socket 10 (FIG. 1) to align the first end portion 13 extending upwardly and the second end portion 14 downwardly. The base portion 17 may be secured, for example, in a groove in base 17, molded into base 17 or secured therein by other suitable means. In order to reduce unnecessary mass and to avoid capacitance-induced signal distortion, the base portion 17 is only sufficiently large to provide a secure and stable anchor for the end beams 15, 16 extending therefrom.

It will be appreciated that while only a single contact pin 11 is visible in FIG. 1, socket 10 will include a plurality of such contact pins arranged and aligned so that each first end 13 is in friction or compression engagement with a terminal lead 21 extending from a device package 20 mounted in socket 10. In the preferred embodiment first end 13 is supported at the end of a curved beam 15 which connects first end 13 to base portion 12. The curved beam 15 is arranged so that a terminal lead 21 positioned in socket 10 will lie on the end face of first end 13 when a device package 20 is inserted into the socket. When the socket 10 is closed the spring formed by curved beam 15 is compressed as first end 13 is deflected downwardly. In the preferred embodiment the beam 15 is sized and positioned so that a pressure of about twenty-eight (28) grams will be exerted on the bottom face of each terminal lead 21 by each first end portion 13 when the socket 10 is in the closed position.

To aid in forming electrically conductive engagement between the end face of first end 13 and terminal lead 21, the end face of end 13 may be scored or scalloped so as to present a roughened end face. Thus, when the beam 15 is compressed the roughened end face slides across the surface of the terminal lead sufficiently to penetrate insulating layers of oxides and the like and assure reliable electrical connection.

The lower beam 16 connecting second end 14 to the base portion 12 also comprises a curved beam and is arranged to position second end 14 so that it extends below the bottom surface 19 of base 17.

As illustrated in FIG. 1 the socket 10 comprises a base 17 which may be secured to the surface of a circuit board, burn-in board or the like by suitable means such as studs 50 or the like. The second ends 14 of the contact pins 11 are, of course, arranged to extend from the lower surface 19 and aligned in register with appropriate contact pads, circuit patterns, etc., on the surface of the board (see FIGS. 3 and 4). The second end 14 is preferably pointed so that assembly of the socket 10 of FIG. 1 or socket 100 of FIGS. 3 and 4 on a circuit board or burn-in board forces the second end 14 into high pressure or gas-tight engagement with the contact pad 41.

Since the base portion 12 is secured in base 17, the length, size, shape and composition of curved beam 15 and lower beam 16 will determine the amount of pressure exerted by the beams against the contact pads and the terminal leads. Furthermore, since the base portion 12 is firmly secured in the base 17, the beams 15, 16 operate independently of each other so that the pressure exerted by the lower beam 16 does not affect the pressure exerted by the curved beam 15 and vice versa.

Figure 2:
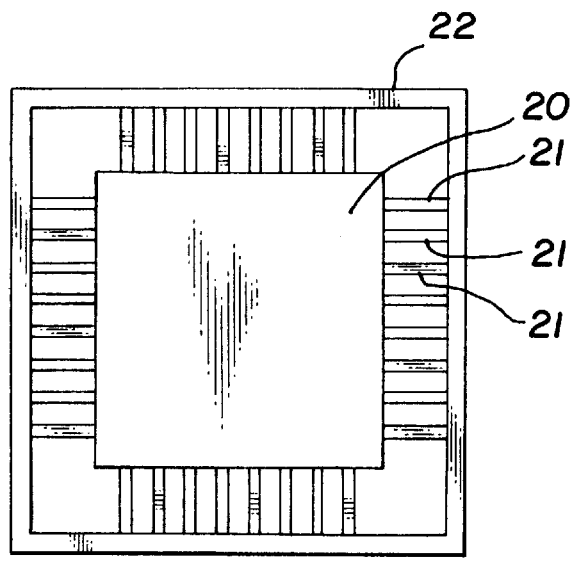
FIG. 2 is a top plan view of a device package in a molded carrier ring assembly structure.

In the embodiment illustrated in FIG. 1 contact pin 11 is used in a socket 10 adapted to mount a device package supported in a molded carrier ring as shown in FIG. 2. As is well-known in the art, QFP packages, SOIC packages and the like are commonly fabricated using a lead frame assembly upon which the circuit chip is mounted and interconnected and the chip then encapsulated in a plastic body 20 as shown in FIG. 2. During fabrication the outer ends of terminal leads 21 are supported in a carrier ring 22. The entire fabrication and assembly can be completed with the ends of the terminal leads 21 supported in the carrier ring which may be molded plastic or part of the original lead frame assembly. This configuration not only aids in fabrication, it also protects the terminal leads 21 from damage and distortion during fabrication. Prior to use, the terminal leads are cut from the carrier ring and re-shaped to form feet 31 as shown in FIGS. 3 and 4 or formed into other configurations such as gull wing leads, through-hole leads, etc. Socket 10, however, is adapted to mount device packages supported in the carrier ring configuration of FIG. 2. The socket of FIG. 1 thus comprises a base 17 which may be secured to a circuit board or the like by studs 50 or other suitable means. A plurality of contact pins 11 are secured in cavity 55 in the base 17 as described hereinabove. The top faces of first ends 13 are aligned and arranged to contact the lower surfaces of the terminal leads 21 extending between the body of device package 20 and the carrier ring 22.

Socket 10 supports a clamp 51 pivotally mounted and extending parallel with one edge of the carrier ring 22. Clamp 51 has an inclined inner surface 52 which terminates in a cam or clamp surface 53. The clamp 51 is urged toward the closed position (illustrated in FIG. 1) by a spring 54 or the like. While only one clamp 51 is illustrated in FIG. 1, it will be appreciated that a similar clamp may be mounted on the opposite edge of the socket and connected with clamp 51 via spring 54 so that the clamps 51 pivot inwardly to trap the carrier ring 22 under cam surface 53.

In the preferred embodiment the cavity 55 is sized to accommodate the carrier ring 22 so that when clamp 51 traps the carrier ring 22 under cam surface 53 the terminal leads 21 are simultaneously urged downwardly against the top surfaces of first ends 13. As noted above, compression of the spring of curved beam 15 causes the end faces of first ends 13 to wipe the underside of the terminal leads 21 to assure good electrical contact.

By appropriately sizing the depth of cavity 55 and the size and shape of curved beams 15, the pressure exerted by each individual first end 13 against each individual terminal lead 21 can be controlled as desired. In the preferred embodiment this pressure should be approximately twenty-eight (28) grams. However, the pressure can be adjusted as required to accommodate different sizes, shapes and compositions of contact pins and terminal leads. Accordingly, the pressure exerted by each individual contact pin on the undersides of terminal leads 21 may be as low as fifteen (15) grams or less or as high as forty-five (45) grams or greater. Similarly, the size, shape and spacing of the lower beam and second end 14 may be controlled as desired to create the required pressure for forming good electrical communication between the second end 14 and the contact pad. In the arrangement illustrated the desired pressure is approximately seventy-eight (78) grams. However, depending on the design functions desired and the materials used, the pressure exerted by the lower beam 16 may be as low as fifty (50) grams or less to as much as one hundred fifty (150) grams or more. In most cases it is preferred that the pressure exerted by the second ends 14 against the contact pads be approximately three times the pressure exerted by first ends 13 against the terminal leads 21.

Socket 10 illustrated in FIG. 1 includes a spreader cap 60 with an inclined surface 81 which operates to spread clamp 51 outwardly when the spreader cap 60 is depressed. Thus, spreader cap 60 automatically opens the socket so that device package 20 may be dropped into the socket without applying any insertion force on the package 20. By releasing pressure on spreader cap 60, springs 54 urge clamps 51 together and thus trap the carrier ring 22 as described hereinabove. Accordingly, the carrier ring 22 is forced into the cavity 55 and terminal leads 21 pressed against first ends 13 of the contact pins 11.

Since inside face 52 of clamp 51 is inclined and clamp 51 is pivotally mounted, carrier ring device packages may be forced into the socket without using the spreader cap 60. For forced insertion, the carrier ring 22 is placed on the inclined surface 52 and forced downwardly into the cavity 55. The carrier ring 22 thus spreads the clamps 51 until the carrier ring passes under cam surface 53. At this point the springs 54 pull the clamps 51 toward the cavity and trap the carrier ring 22 in the position shown in FIG. 1. Thus the socket 10 of FIG. 1 may be used as either a zero insertion force socket or a forced insertion socket.

Socket 100 illustrated in FIGS. 3 and 4 utilizes the contact pin structure described hereinabove to form electrical contact between the foot 31 of a terminal lead 21 and a contact pad 41 on the surface of a circuit board 40. As described hereinabove, the contact pins 11 are securely positioned within the electrically insulating base 17 of socket 100 so that each second end 14 extends from the lower surface of base 17 and the first end 13 extends upwardly. When the socket 100 is mounted on circuit board 40, second ends 14 are secured to contact pads 41 to form electrical interconnection between the contact pin 11 and circuitry on the board 40. In the embodiment illustrated in FIGS. 3 and 4 the terminal leads 21 extending from device package 20 have been cut from the carrier ring 22 and formed into a Z-shape so that each terminal lead 21 extends outwardly, downwardly and outwardly to form a foot 31 with a lower face lying in a plane substantially parallel with and spaced below the bottom surface of package 20.

Socket 100 includes a clamp 61 formed of electrically insulating material supported on spring 62 which urges the clamp 61 against the top of each foot 31. Socket 100 is opened for insertion of a device package by depressing spreader cap 63. As illustrated in FIG. 4 spreader cap 63 is pressed downwardly and urges clamp 61 outwardly to open the socket. The device package 20 may thus be inserted into the socket and aligned with each foot 31 of terminal leads 21 resting on the end face of a first end 13. Appropriate guides (not illustrated) orient the device package 20 and secure it in proper alignment with the contact pins. When pressure on the spreader cap 63 is released, clamp 61 returns to the position illustrated in FIG. 3 to contact the top surface of each foot 31 and press the feet 31 of terminal leads 21 into intimate contact with the first end portions 13 of contact pins 11. As described above, spring 62 is designed to force the feet 31 downwardly so that each foot 31 exerts the desired pressure against the end face of first end 13. Compression of curved beams 15 causes deflection of each end face to wipe the lower surface of each foot 31 to ensure good electrical contact. Removal of the device package 20 is accomplished by reversing the insertion procedure.

It will be recognized that all components of the test socket of the invention may be fabricated from readily available materials using conventional techniques. Of course, when the socket is to be used as a burn-in socket, materials must be chosen which will withstand the temperatures involved as well as repeated usage. It will also be recognized that loading and unloading of device packages 20 may readily be automated using conventional techniques.

It will be apparent from the foregoing that the principles of the invention may be used to mount and form temporary electrical contact with the terminal leads of various device packages without risk of damaging the device or its terminal leads. Because of the unique structure, sockets employing the invention may be used for burn-in and/or test of high frequency devices without concern for signal distortion introduced by the test socket or its interconnection with the board. It is to be understood, however, that even though numerous characteristics and advantages of the invention have been set forth in the foregoing description together with details of the structure and function of various embodiments, this disclosure is to be considered illustrative only. Various changes and modifications may be made in detail, especially in matters of shape, size, arrangement and combination of parts, without departing from the spirit and scope of the invention as defined by the appended claims.

What is claimed:

1. The combination comprising:
   (a) a circuit board having a circuit pattern with contact pads on the top surface thereof;
   (b) an electronic device package having terminal leads extending from at least one edge thereof positioned so that at least a portion of the bottom surface of each of said terminal leads is spaced from and extends substantially parallel with the top surface of said circuit board; and
   (c) an electrically conductive contact pin having first and second ends positioned between one of said terminal leads and one of said contact pads with said first end engaging the bottom surface of the terminal lead and said second end engaging the top surface of the contact pad to provide a circuit path between the terminal lead and the contact pad, wherein said contact pin is supported independently of said device package and said circuit board and maintains the force exerted by said second end on the top surface of the contact pad at approximately three times the force exerted by said first end on the terminal lead.

2. The combination defined in claim 1 wherein said contact pin includes a base portion secured in an electrically insulating base medium with said first end supported on a curved beam extending from said base portion and said second end supported on a second beam extending from said base portion.

3. The combination defined in claim 1 herein said first end exerts a pressure of about fifteen (15) grams to about forty-five (45) grams on said terminal lead and said second end exerts a pressure of about fifty (50) grams to about one hundred fifty (150) grams on said contact pad.

4. The combination defined in claim 1 wherein said circuit board is a burn-in board.

5. The combination defined in claim 2 wherein said electrically insulating base medium comprises the base portion of a socket mounted on the surface of said circuit board.

6. The combination defined in claim 5 wherein said socket includes a moveable clamp for urging said terminal lead against said first end.

7. A socket for mounting electronic device packages comprising:

(a) an electrically insulating base having a cavity therein and a lower surface; and (b) a plurality of electrically conductive contact pins, each comprising a base portion with a first end extending therefrom in a first direction and a second end extending therefrom in the opposite direction, secured within said insulating base so that said first ends project into said cavity and said second ends each includes a curved beam which terminates in an end which extends from said lower surface and is adapted to exert pressure on the contact pad of a circuit board or the like which is approximately three times any pressure exerted on the first end of such pin, and (c) means for uniformly urging terminals of an electronic device package supported within said cavity against the end faces of said first ends.

8. A socket as defined in claim 7 wherein said means for uniformly urging terminal leads is a pivotally mounted electrically insulating clamp.

9. A socket as defined in claim 7 wherein said means for uniformly urging terminal leads is a pivotally mounted member which is moveable between a first position and a second position in which it traps a carrier ring in said cavity.

10. The method of establishing temporary electrical communication between a terminal lead extending from an electronic device package and a circuit contact pad on the surface of a circuit board or the like comprising the steps of:

(a) mounting an electrically conductive contact pin having a base portion with a first end extending in a first direction therefrom and a second end extending in the opposite direction in an electrically insulating base so that said base portion is rigidly secured in said insulating base and said second end extends from said insulating base;

(b) securing an electronic device package to said insulating base so that a terminal lead extending therefrom is urged into contact with the first end of said contact pin; and (c) mounting said insulating base on the surface of a circuit board or the like so that said second end is urged into physical contact with a contact pad on said surface of the circuit board or the like with a force which is approximately three times the force exerted on the terminal lead by the first end portion.

\* \* \* \* \*